United States Patent [19]
Hacker et al.

[11] Patent Number: 6,143,855
[45] Date of Patent: *Nov. 7, 2000

[54] ORGANOHYDRIDOSILOXANE RESINS WITH HIGH ORGANIC CONTENT

[75] Inventors: Nigel P. Hacker, San Martin; Scott Lefferts, Sunnyvale; Lisa Figge, Menlo Park, all of Calif.

[73] Assignee: AlliedSignal Inc., Morristown, N.J.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/044,798

[22] Filed: Mar. 20, 1998

Related U.S. Application Data

[60] Provisional application No. 60/044,481, Apr. 21, 1997.

[51] Int. Cl.[7] .................................................. C08G 77/12
[52] U.S. Cl. ............................................... 528/31; 528/21
[58] Field of Search ....................................... 528/31, 21

[56] References Cited

U.S. PATENT DOCUMENTS

| | | | |
|---|---|---|---|
| 2,637,718 | 5/1953 | Rust ........................................ | 260/46.5 |
| 3,615,272 | 10/1971 | Collins et al. ............................ | 23/366 |
| 4,026,868 | 5/1977 | Merrill ............................... | 260/46.5 R |
| 4,399,266 | 8/1983 | Matsumura et al. ...................... | 528/10 |
| 4,609,751 | 9/1986 | Hajjar ....................................... | 556/456 |
| 4,626,556 | 12/1986 | Nozue et al. ............................. | 522/99 |
| 4,670,299 | 6/1987 | Fukuyama et al. ....................... | 427/96 |
| 4,694,040 | 9/1987 | Hashimoto et al. ...................... | 524/765 |
| 4,723,978 | 2/1988 | Clodgo et al. ............................ | 65/31 |
| 4,749,631 | 6/1988 | Haluska et al. .......................... | 428/704 |
| 4,753,855 | 6/1988 | Haluska et al. .......................... | 428/702 |
| 4,756,977 | 7/1988 | Haluska et al. .......................... | 428/704 |
| 4,808,653 | 2/1989 | Haluska et al. .......................... | 524/398 |
| 4,822,697 | 4/1989 | Haluska et al. .......................... | 428/698 |
| 4,847,162 | 7/1989 | Haluska et al. .......................... | 428/457 |
| 4,849,296 | 7/1989 | Haluska et al. .......................... | 428/457 |
| 4,895,914 | 1/1990 | Saitoh et al. ............................. | 525/478 |
| 4,898,907 | 2/1990 | Haluska et al. .......................... | 524/490 |
| 4,911,992 | 3/1990 | Haluska et al. .......................... | 428/698 |
| 4,973,526 | 11/1990 | Haluska ................................... | 428/697 |
| 4,999,397 | 3/1991 | Weiss et al. .............................. | 524/755 |
| 5,008,320 | 4/1991 | Haluska et al. .......................... | 524/361 |
| 5,010,159 | 4/1991 | Bank et al. ............................... | 528/23 |
| 5,045,592 | 9/1991 | Weiss et al. .............................. | 524/755 |
| 5,059,448 | 10/1991 | Chandra et al. .......................... | 427/53.1 |
| 5,063,267 | 11/1991 | Hanneman et al. ...................... | 524/284 |
| 5,085,893 | 2/1992 | Weiss et al. .............................. | 427/387 |
| 5,091,162 | 2/1992 | Frye et al. ................................ | 423/325 |
| 5,106,604 | 4/1992 | Agaskar .................................... | 423/325 |
| 5,116,637 | 5/1992 | Baney et al. ............................. | 427/340 |
| 5,118,530 | 6/1992 | Hanneman et al. ...................... | 427/226 |
| 5,145,723 | 9/1992 | Ballance et al. ......................... | 427/397.7 |
| 5,165,955 | 11/1992 | Gentle ...................................... | 427/575 |
| 5,183,684 | 2/1993 | Carpenter ................................. | 427/574 |
| 5,210,168 | 5/1993 | Bergstrom et al. ...................... | 528/12 |
| 5,238,787 | 8/1993 | Haluska et al. .......................... | 430/325 |
| 5,258,334 | 11/1993 | Lantz, II .................................. | 437/238 |
| 5,262,201 | 11/1993 | Chandra et al. .......................... | 427/376.2 |
| 5,279,661 | 1/1994 | Gentle ...................................... | 106/287.1 |
| 5,283,545 | 2/1994 | Pernisz .................................... | 338/308 |
| 5,290,354 | 3/1994 | Haluska ................................... | 106/497 |
| 5,293,335 | 3/1994 | Pernisz et al. ........................... | 365/148 |
| 5,310,583 | 5/1994 | Eckstein et al. ......................... | 427/575 |
| 5,312,684 | 5/1994 | Michael et al. .......................... | 428/336 |
| 5,320,868 | 6/1994 | Ballance et al. ......................... | 427/228 |
| 5,336,532 | 8/1994 | Haluska et al. .......................... | 427/515 |
| 5,348,839 | 9/1994 | Haluska et al. .......................... | 430/270 |
| 5,370,903 | 12/1994 | Mine et al. ............................... | 427/126.2 |
| 5,370,904 | 12/1994 | Mine et al. ............................... | 427/126.2 |
| 5,372,842 | 12/1994 | Mine et al. ............................... | 427/126.2 |
| 5,380,567 | 1/1995 | Haluska ................................... | 427/578 |
| 5,416,190 | 5/1995 | Mine et al. ............................... | 528/492 |
| 5,436,029 | 7/1995 | Ballance et al. ......................... | 427/126.2 |
| 5,441,765 | 8/1995 | Ballance et al. ......................... | 427/228 |
| 5,445,894 | 8/1995 | Haluska et al. .......................... | 428/557 |
| 5,446,088 | 8/1995 | Haluska ................................... | 524/588 |
| 5,486,564 | 1/1996 | Mine et al. ............................... | 524/588 |
| 5,523,163 | 6/1996 | Ballance et al. ......................... | 428/446 |
| 5,540,948 | 7/1996 | Haluska ................................... | 427/96 |
| 5,547,703 | 8/1996 | Camilletti et al. ....................... | 427/126.3 |
| 5,609,925 | 3/1997 | Camilletti et al. ....................... | 427/503 |
| 5,618,878 | 4/1997 | Syktich et al. ........................... | 524/558 |
| 5,635,240 | 6/1997 | Haluska et al. .......................... | 427/180 |
| 5,707,681 | 1/1998 | Bremmer et al. ........................ | 427/58 |
| 5,707,683 | 1/1998 | Currie et al. ............................. | 427/126.2 |
| 5,853,808 | 12/1998 | Arkles et al. ............................ | 427/377 |
| 5,858,544 | 1/1999 | Holl et al. ................................ | 428/447 |

FOREIGN PATENT DOCUMENTS

| | | |
|---|---|---|
| 2100278 | 1/1994 | Canada . |
| 0 270 229 A2 | 6/1988 | European Pat. Off. . |
| 0 270 231 A2 | 6/1988 | European Pat. Off. . |
| 0 270 263 A2 | 6/1988 | European Pat. Off. . |
| 0 270 369 A2 | 6/1988 | European Pat. Off. . |
| 0 323 103 A2 | 7/1989 | European Pat. Off. . |

(List continued on next page.)

OTHER PUBLICATIONS

Hacker, N., "Organic and Inorganic Spin–On Polymers for Low–Dielectic–Constant Applications," *MRS Bulletin*, vol. 22, No. 10, Oct. 1997, pp. 33–38.

*Primary Examiner*—David W. Wu
*Assistant Examiner*—Aixia Lin
*Attorney, Agent, or Firm*—Skjerven, Morrill, MacPherson, Franklin and Friel; Roberta Saxon

[57] ABSTRACT

An organohydridosiloxane polymer having a cage conformation, at least approximately 40 Mole percent carbon containing substituents and a dielectric constant of less than about 2.7 is presented. Each silicon atom of the cage polymer is bonded to at least three oxygen atoms and to either a hydrogen atom or an organic substituent. By providing such a caged structure with essentially no hydroxyl or alkoxy substituents, either on the polymer backbone or at terminal silicon atoms, essentially no chain lengthening polymerization can occur in solution. Such organohydridosiloxane resins having a molecular weight in the range from about 400 to about 200,000 atomic mass units were formed using a dual phase solvent system and either a solid phase or phase transfer catalyst to assist the condensation of hydridotrihalosilane with at least one organotrihalosilane.

6 Claims, No Drawings

FOREIGN PATENT DOCUMENTS

| | | |
|---|---|---|
| 0 323 186 A2 | 7/1989 | European Pat. Off. . |
| 0 410 564 A2 | 1/1991 | European Pat. Off. ........ C08G 77/08 |
| 0 419 076 A1 | 3/1991 | European Pat. Off. . |
| 0 427 395 A1 | 5/1991 | European Pat. Off. . |
| 0 461 782 A2 | 12/1991 | European Pat. Off. . |
| 0 461 782 A3 | 12/1991 | European Pat. Off. . |
| 0 462 715 A1 | 12/1991 | European Pat. Off. . |
| 0 466 205 A1 | 1/1992 | European Pat. Off. . |
| 0 493 879 A2 | 7/1992 | European Pat. Off. . |
| 0 510 872 A1 | 10/1992 | European Pat. Off. . |
| 0 512 717 A3 | 11/1992 | European Pat. Off. . |
| 0 516 144 A1 | 12/1992 | European Pat. Off. . |
| 0516 308 A1 | 12/1992 | European Pat. Off. . |
| 0 560 485 A1 | 9/1993 | European Pat. Off. . |
| 0 599 209 A2 | 1/1994 | European Pat. Off. . |
| 0 596 678 A2 | 5/1994 | European Pat. Off. . |
| 0 604 779 A1 | 7/1994 | European Pat. Off. . |
| 0 606 580 A1 | 7/1994 | European Pat. Off. . |
| 0 606 588 A1 | 7/1994 | European Pat. Off. . |
| 0 615 000 A1 | 9/1994 | European Pat. Off. . |
| 0 616 001 A1 | 9/1994 | European Pat. Off. . |
| 0 686 680 A1 | 12/1995 | European Pat. Off. ...... C09D 183/05 |
| 0 725 103 A2/A3 | 8/1996 | European Pat. Off. . |
| 19608904A1 | 9/1996 | Germany ........................ C08G 77/12 |
| 52-31854 | 8/1977 | Japan . |
| 53-88099 | 8/1978 | Japan . |
| 55-111148 | 8/1980 | Japan . |
| 56-139533 | 10/1981 | Japan . |
| 57-112047 | 7/1982 | Japan . |
| 58-003249 | 1/1983 | Japan . |
| 58-066335 | 4/1983 | Japan . |
| 59-109565 | 6/1984 | Japan . |
| 59-189126 | 10/1984 | Japan . |
| 59-190211 | 10/1984 | Japan . |
| 60-42426 | 3/1985 | Japan . |
| 60-86017 | 5/1985 | Japan . |
| 60-124943 | 7/1985 | Japan . |
| 61-029153 | 2/1986 | Japan . |
| 61-127732 | 6/1986 | Japan . |
| 61-292342 | 12/1986 | Japan . |
| 2-277255 | 11/1990 | Japan . |
| 3-6845 | 1/1991 | Japan . |
| 03227321 | 8/1991 | Japan ............................ C08G 77/16 |
| 3-227321 | 10/1991 | Japan . |
| 4-252228 | 9/1992 | Japan . |
| 4-252229 | 9/1992 | Japan . |
| WO 97/10282 | 3/1997 | WIPO ............................ C08G 77/24 |

ORGANOHYDRIDOSILOXANE RESINS WITH HIGH ORGANIC CONTENT

CROSS-REFERENCE TO RELATED APPLICATIONS

A related application entitled "ORGANOHYDRIDOSILOXANE RESINS WITH LOW ORGANIC CONTENT", by the inventors of the present application, U.S. application Ser. No. 09/044,831, is filed concurrently herewith. This application claims the benefit of U.S. Provisional Application No. 60/044,481, filed Apr. 21, 1997, which is incorporated herein by reference.

BACKGROUND

1. Field of the Invention

The present invention relates generally to siloxane-based resins, and more specifically to the synthesis of novel siloxane based resins and the low dielectric constant films formed therefrom.

2. Related Art

Semiconductor devices often have one or more arrays of patterned interconnect levels that serve to electrically couple the individual circuit elements thus forming an integrated circuit (IC). These interconnect levels are typically separated by an insulating or dielectric film. Previously, a silicon oxide film formed using chemical vapor deposition (CVD) or plasma enhanced CVD (PECVD) techniques was the most commonly used material for such dielectric films. However, as the size of circuit elements and the spaces between such elements decreases, the relatively high dielectric constant of such silicon oxide films is problematic.

In order to provide a lower dielectric constant than that of silicon oxide, dielectric films formed from siloxane based resins are becoming widely used. One such family of films formed from siloxane based resins are the films derived from hydrogen silsesquioxane (HSQ) resins (See, U.S. Pat. No. 3,615,272, Oct. 19, 1971, Collins et al.; and U.S. Pat. No. 4,756,977, Jul. 12, 1988, Haluska et al.) However, while such films do provide lower dielectric constants than CVD or PECVD silicon oxide films and also provide other benefits such as enhanced gap filling and surface planarization, it has been found that typically the dielectric constants of such films are limited to approximately 3.0 or greater (See, U.S. Pat. No. 5,523,163, Jun. 4, 1996, Ballance et al.).

As known, the dielectric constant of such insulating films is an important factor where IC's with low power consumption, cross-talk, and signal delay are required. As IC dimensions continue to shrink, this factor increases in importance. As a result, siloxane based resin materials, and methods for making such materials, that can provide insulating films with dielectric constants below 3.0 are very desirable. In addition, it would be desirable to have siloxane-based resins, and method for making the resins, that provide such low dielectric constant films and which additionally have a high resistance to cracking. It could also be desirable for such films to have low stress when formed in thicknesses of approximately 1.0 micron ($\mu$m) or greater. Additionally, it would be desirable for such siloxane-based resins, and methods for making, to provide low dielectric constant films via standard processing techniques. In this manner curing processes that require an ammonia or ammonia derivative type of atmosphere (See, U.S. Pat. No. 5,145,723, Sep. 8, 1992, Ballance et al.), an ozone atmosphere (See, U.S. Pat. No. 5,336,532, Haluska et al.), or other non-standard type of semiconductor process, are avoided.

SUMMARY

In accordance with the present invention, organohydridosiloxane resins, and methods for making such resins, are provided. Solutions of such organohydridosiloxane resins are employed for forming caged siloxane polymer films useful in the fabrication of a variety of microelectronic devices, particularly semiconductor integrated circuits.

The organohydridosiloxane resins of the present invention have one of the four general formulae:

$$(HSiO_{1.5})_n(RSiO_{1.5})_m \quad \text{Formula 1}$$

$$(H_{0.4-1.0}SiO_{1.5-1.8})_n(R_{0.4-1.0}SiO_{1.15-1.8})_m \quad \text{Formula 2}$$

$$(H_{0-1.0}SiO_{1.5-2.0})_n(RSiO_{1.5})_m \quad \text{Formula 3}$$

wherein
the sum of n and m is from about 8 to about 5000 and m is selected such that the organic substituent is present to about 40 Mole percent (Mol %) or greater;

$$(HSiO_{1.5})_x(RSiO_{1.5})_y(SiO_2)_z \quad \text{Formula 4}$$

wherein:
the sum of x, y and z is from about 8 to about 5000 and y is selected such that the organic substituent is present to about 40 mole percent (Mol %) or greater; and
R is selected from substituted and unsubstituted groups including normal and branched alkyl groups, cycloalkyl groups, aryl groups, and mixtures thereof;
wherein the specific Mol % of organic or carbon containing substituents is a function of the ratio of the amounts of starting materials.

Polymers in accordance with the present invention have a caged structure with a polymer backbone encompassing alternate silicon and oxygen atoms. In particular, each backbone silicon atom is bonded to at least three backbone oxygen atoms. In contrast with previously known organosiloxane resins, polymers of the present invention have essentially no hydroxyl or alkoxy groups bonded to backbone silicon atoms. Rather, each silicon atom, in addition to the aforementioned backbone oxygen atoms, is bonded only to hydrogen atoms and/or the 'R' groups defined in Formulae 1, 2, 3 and 4. By attaching only hydrogen and/or 'R' groups directly to backbone silicon atoms in the polymer, the shelf life of organohydridosiloxane resin solutions in accordance with the present invention is enhanced as compared to solutions of previously known organosiloxane resins.

In accordance with the methods of this invention, the synthesis of the organohydridosiloxane compositions of this invention include a dual phase solvent system using a catalyst. In some embodiments of the present invention, the starting materials encompass trichlorosilane and one or more organotrichlorosilanes, for example either an alkyl or an aryl substituted trichlorosilane.

In some embodiments, the methods of this invention include mixing a solution of at least one organotrihalosilane and hydridotrihalosilane to form a mixture; combining the mixture with a dual phase solvent which includes both a non-polar solvent and a polar solvent; adding a catalyst to the dual phase solvent and trihalosilane mixture, thus providing a dual phase reaction mixture; reacting the dual phase reaction mixture to produce an organohydridosiloxane; and recovering the organohydridosiloxane from the non-polar portion of the dual phase solvent system.

In some embodiments, additional steps may include washing the recovered organohydridosiloxane to remove any low molecular weight species, and fractionating the organohydridosiloxane product to thereby classify the product according to molecular weight.

In some embodiments, the catalyst is a phase transfer catalyst including, but not limited to, tetrabutylammonium chloride and benzyltrimethylammonium chloride. In other embodiments the catalyst is a solid phase catalyst, such as Amberjet 4200 or Amberlite I-6766 ion exchange resin (Rohm and Haas Company, Philadelphia, Pa.).

In some embodiments of the present invention, the mount of organotrihalosilane monomer present is an amount sufficient to provide an as-cured dielectric film having an organic content of at least approximately 40 Mol % carbon containing substituents. Such dielectric films formed in accordance with the present invention advantageously provide low dielectric constants, typically less than 2.7. Additionally, dielectric films in accordance with the organohydridosiloxane compositions of this invention exhibit thermal stability permitting cure temperatures of about 425 degrees Centigrade (° C.) or greater.

DETAILED DESCRIPTION

As the present invention is described with reference to various embodiments thereof, it will be understood that these embodiments are presented as examples and not limitations of this invention. Thus, various modifications or adaptations of the specific materials and methods may become apparent to those skilled in the art. All such modifications, adaptations or variations that rely upon the teachings of the present invention as illustrated by the embodiments herein, are considered to be within the spirit and scope of the present invention. For example, while the embodiments herein typically use a chlorinated silane monomer, other monomers such as trifluorosilane, tribromosilane, organotrifluorosilane, and organotribromosilane can also be employed.

The organohydridosiloxane resins of the present invention have one of the four general formulae:

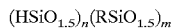
$(HSiO_{1.5})_n(RSiO_{1.5})_m$  Formula 1

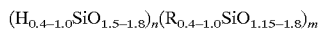
$(H_{0.4-1.0}SiO_{1.5-1.8})_n(R_{0.4-1.0}SiO_{1.15-1.8})_m$  Formula 2

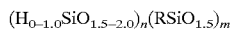
$(H_{0-1.0}SiO_{1.5-2.0})_n(RSiO_{1.5})_m$  Formula 3 wherein:
the sum of n and m is from about 8 to about 5000 and m is selected such that the organic substituent is present to about 40 Mole percent (Mol %) or greater;

$(HSiO_{1.5})_x(RSiO_{1.5})_y(SiO_2)_z$  Formula 4 wherein:
the sum of x, y and z is from about 8 to about 5000 and y is selected such that the organic substituent is present to about 40 mole percent (Mol %) or greater; and
R is selected from substituted and unsubstituted groups including normal and branched alkyl groups, cycloalkyl groups, aryl groups, and mixtures thereof;
wherein the specific Mol % of organic or carbon containing substituents is a function of the ratio of the amounts of starting materials.

In some embodiments of the present invention, the substituted and unsubstituted normal and branched alkyl groups have between about 1 and 20 carbons; the substituted and unsubstituted cycloalkyl groups have between about 4 and 10 carbons and the substituted and unsubstituted aryl groups have between about 6 and 20 carbons. For example, where 'R' is an alkyl group, 'R' includes but is not limited to methyl, chloromethyl and ethyl groups, and the normal and branched propyl, 2-chloropropyl, butyl, pentyl and hexyl groups. Where 'R' is a cycloalkyl group, 'R' includes but is not limited to cyclopentyl, cyclohexyl, chlorocyclohexyl and cycloheptyl groups; where 'R' is an aryl group, 'R' includes but is not limited to phenyl, naphthyl, tolyl and benzyl groups. It will be understood, that the specific carbon content of any specific organohydridosiloxane resin, in accordance with this invention, is a function of the mole ratio of organotrihalosilane(s) to hydridotrihalosilane starting materials employed. Thus, for any 'R' group selected, a resin in accordance with the present invention having a carbon containing substituent present in an amount of at least 40 Mol % is provided.

Advantageously, embodiments in accordance with the present invention are polymers having a caged structure with a polymer backbone encompassing alternate silicon and oxygen atoms. In particular, each backbone silicon atom is bonded to at least three backbone oxygen atoms to form the aforementioned cage structure. Essentially all additional silicon bonds are only to hydrogen and the organic substituents defined in Formulae 1, 2, 3 and 4. Thus, polymers of the present invention have essentially no hydroxyl or alkoxy groups bonded to backbone silicon atoms and cross-linking reactions are suppressed.

In contrast, previously known organosiloxane resins have high levels of alkoxy groups bonded to backbone silicon atoms, thus significant hydrolysis to form silanol groups is observed. This hydrolysis results in higher dielectric constants for the as-cured polymer films formed from these previously known resins, as well as reduced shelf life of solutions of these resins. The latter due to unwanted chain lengthening and cross-linking.

Thus embodiments of the present invention, by providing only hydrogen and organic groups directly bonded to backbone silicon atoms, avoid unwanted chain lengthening and cross-linking caused by condensation of the hydroxyl or silanol groups. Consequently, the shelf life of solutions of organohydridosiloxane resins in accordance with this invention is significantly prolonged over similar solutions of the previously known resins.

In accordance with the methods of this invention, the synthesis of the organohydridosiloxane compositions of this invention include a dual phase solvent system using a catalyst. In some embodiments of the present invention, the starting materials encompass trichlorosilane and one or more organotrichlorosilanes, for example organotrichlorosilanes having the substituted and unsubstituted groups defined with respect to Formulae 1 to 4, above.

In some embodiments, the catalyst is a phase transfer catalyst including, but not limited to, tetrabutylammonium chloride and benzyltrimethylammonium chloride. For example, bromide, iodide, fluoride or hydroxide anions are employed in some embodiments in place of the previously mentioned chloride anions. The phase transfer catalyst is introduced into the reaction mixture and the reaction is allowed to proceed to the desired degree of polymerization.

In other embodiments the catalyst is a solid phase catalyst, such as Amberjet 4200 or Amberlite I-6766 ion exchange resin (Rohm and Haas Company, Philadelphia, Pa.). Amberjet 4200 and Amberlite I-6766 are basic anion exchange resins. By way of explanation, and not by way of limitation, it is believed that the resin facilitates the hydrolysis of the Si—Cl bonds of the monomer to Si—OH. The hydrolysis is followed by condensation of two Si—OH moieties to provide an Si—O—Si bond.

In accordance with one aspect of the method of this invention, a dual phase solvent system includes a continuous phase non-polar solvent and a polar solvent. The non-polar solvent includes, but is not limited to, any suitable aliphatic or aromatic compounds or a mixture of any or all such suitable compounds, the operational definition of "suitable" in the present context includes the functional characteristics of:

1) solubilizing the monomeric trihalosilane compounds, 2) solubilizing the organohydridosiloxane resin products as they are formed and increase in molecular weight, 3) stability of the organohydridosiloxane resin products in the solvent, and 4) insolubility of unwanted reaction products in the non-polar solvent.

Exemplary non-polar solvents include, but are not limited to, pentane, hexane, heptane, cyclohexane, benzene, toluene, xylene, halogenated solvents such as carbon tetrachloride and mixtures thereof.

The polar phase, is immiscible with the non-polar solvent phase, and includes water, alcohols, and alcohol and water mixtures. The amount of alcohol present is sufficient to ensure sufficient solubility of the organotrihalosilane monomers.

It has been found that a polar solvent to non-polar solvent ratio of between about 5 percent weight to weight (% w/w) to 80% w/w is desirable and between about 9% w/w to about 40% w/w preferred.

Exemplary alcohols and other polar solvents suitable for use in the polar phase include, but are not limited to, water, methanol, ethanol, isopropanol, glycerol, diethyl ether, tetrahydrofuran, diglyme and mixtures thereof. In one embodiment, the polar solvent includes a water/alcohol mixture wherein the water is present in an amount sufficient to preferentially solubilize ionic impurities not soluble in alcohol, and/or preclude solvent extraction of product compounds that might otherwise be soluble in alcohol. The polar solvent phase advantageously retains the hydrochloric acid (HCl) condensation product and any metal salt or other ionic contaminants, that may be present. As essentially all ionic contaminants are retained in the polar solvent phase, the organohydridosiloxane product of this invention is of high purity and contains essentially no ionic contaminants.

It will be understood, that in addition to retaining HCl condensation products and other ionic contaminants in the polar phase, the methods of the present invention also provide for high purity organohydridosiloxane product by avoiding sources of ionic contamination. Thus, in contrast to the methods for making the previously known organosiloxane resins, methods in accordance with the present invention do not employ metal catalysts or very strong inorganic acids, e.g. fuming sulfuric acid. In this manner, the extraction or leaching of metal contaminants by such strong acids or inclusion of metal catalyst residues are avoided and high purity organohydridosiloxane product obtained.

A mixture of the organic and hydridosilanes (e.g. trichlorosilane and methyltrichlorosilane) is added to a mixture of catalyst, hydrocarbon solvent, alcohol and water. The mixture is filtered, the water is separated, the solution is dried and then evaporated to leave a white solid. This solid is slurried in hydrocarbon solvent to remove monomer and then evaporated to leave desired product that can be formulated in a suitable solvent for use as a spin-on polymer. The molecular weight (Mw) of the product produced can be varied between 400 and 200,000 atomic mass units (amu) depending on the reaction conditions. It has been found that materials with a Mw of between approximately 5,000 to 60,000 amu are desirable. It has also been found that materials with a Mw of between approximately 10,000 to 50,000 amu are somewhat more desirable and materials with a Mw of between approximately 20,000 to 40,000 amu are most desirable.

EXPERIMENTAL METHODS

The following characteristics encompass non-limiting measurements that illustrate the properties of organohydridosiloxane polymer resins of the present invention. The methods of measurement used are as follows:

1) Film Thickness (Å): Film thickness is measured using a calibrated Nanospec® AFT-Y CTS-102 model 010-180 Film Thickness Measurement System available from Nanometrics, Co. An average of measurements at five locations on a wafer are reported as the film thickness for each sample.

2) Molecular Weight ("MW"): Molecular weight is determined using a gel phase chromatography system from Waters Corporation, Milford, Mass., equipped with a Waters 510 pump, Waters 410 differential refractometer and a Waters 717 autosampler. As is the customary practice in the field of silicon polymers, weight average molecular weight is reported. The procedure used is as set forth by S. Rosen in "Fundamental Principles of Polymeric Materials, pages 53–81, (2nd Ed. 1993) and incorporated herein by reference.

3) Dielectric Constant: Dielectric constant is determined using the capacitance-voltage ("CV") measurement technique and employs a Hewlett-Packard Model 4061A semiconductor measurement system at a frequency of 1 MHz. This test procedure employs a metal-insulator-metal (MIM) structure with the thickness of each layer ranging from about 0.5 to 1 micron ($\mu$m).

METHOD OF MAKING

A mixture of the organic and hydridosilanes (e.g. trichlorosilane and methyltrichlorosilane) is added to a mixture of catalyst, non-polar solvent, and polar solvent to form a reaction mixture. The polymerization reaction is allowed to proceed. Upon completion of the polymerization reaction, the reaction mixture is filtered, the polar solvent is separated, and the solution is dried and then evaporated to leave a white solid. This solid may then be slurried in a hydrocarbon solvent to remove residual monomer, and finally evaporated to leave the desired product. In some embodiments of the present invention, organohydridosiloxanes are formulated in a suitable solvent for use as a spin-on-dielectric film.

EXAMPLES 1 THROUGH 6

Examples 1 through 6 describe the synthesis of various methylhydridosiloxanes. These descriptions illustrate how the Mole percent of organic or carbon containing substituent, incorporated into the product resin, is controlled by adjusting the ratio of the relative amounts of starting monomers. It will be understood by one skilled in the art that the same means for controlling Mole percent of organic or carbon containing substituent in the methylhydridosiloxanes described can be employed for any other organohydridosiloxane species.

EXAMPLE 1

40 Mole Percent Methylhydridosiloxane

A 6 L jacketed reactor equipped with a nitrogen inlet, dry ice condenser and a mechanical stirrer was charged with 5000 mL hexanes 720 mL ethanol, 65 mL water and 120 g of a 10% by weight tetrabutylammonium chloride hydrate solution in water. The mixture was equilibrated for 0.5 hr with stirring at 25° C. A mixture of trichlorosilane (377.4 g, 2.78 Mol) and methyltrichlorosilane (277.7 g, 1.86 Mol) were added to the reactor using a peristaltic pump over a period of 70 minutes. Upon completion of the silane addition, hexane was pumped through the lines for 10 minutes. The reaction was stirred for 2.3 hours, the ethanol/$H_2O$ layer was removed and then the remaining hexane solution filtered through a 3 micron ($\mu$m) filter, followed by a 1 $\mu$m filter. The filtered solution was dried by flowing through a column of 4 Å molecular sieves (800 g) for 2.5 h and then filtered through a 0.05 $\mu$m filter. The hexanes were removed using a rotary evaporator to give 111 g of a white solid product. The GPC of this product, referenced to polystyrene standards, gave a Mw of 24,683 amu.

EXAMPLE 2

50 Mole Percent Methylhydridosiloxane

A 250 mL Morton flask was fitted with a condenser and a stirrer connected to an Arrow 1750 motor. The flask was purged with $N_2$ and during the reaction $N_2$ was blown across the top of the condenser into an NaOH scrubber. 18 g of Amberjet 4200 (Cl) ion exchange resin catalyst, 20 mL of ethanol, 6.3 mL of water, and 250 mL of hexanes were added to the flask, and stirring was started. Trichlorosilane (6.7 g, 0.05 Mol) and methyltrichlorosilane (8.24 g, 0.05 mol) were combined together in an HDPE bottle. This mixture of silanes was added to the Morton flask through a peristaltic pump at a rate of 0.65 mL/min. After addition was completed, stirring was continued for 120 min., then solution was allowed to settle for 30min. The solution was filtered by vacuum through a Whatman #4 filter in a Buchner funnel. The solution was added to a separatory funnel and a lower, aqueous layer was discarded. The upper layer was dried over 40.23 g of 4 Å molecular sieves for 3 hr. Solution was filtered by vacuum through a Whatman #1 filter paper in a Buchner funnel. Solution was evaporated on a Buchi rotary evaporator at 60° C. 8.3 g of white solid was collected. The GPC of this product, referenced to polystyrene standards gave a Mw of 12,146 amu.

EXAMPLE 3

60 Mole Percent Methylhydridosiloxane

A 6 L jacketed reactor equipped with a nitrogen inlet, dry ice condenser and a mechanical stirrer was charged with 5000 mL hexanes 720 mL ethanol, 50 mL water and 120 g of a 100% by weight tetrabutylammonium chloride hydrate solution in water. This mixture was equilibrated for 0.5 hr with stirring at 25° C. A mixture of trichlorosilane (251.6 g, 1.85 Mol) and methyltrichlorosilane (416.5 g, 2.78 Mol) were added to the reactor using a peristaltic pump over a period of 70 minutes. Upon completion of the silane addition, hexane was pumped through the lines for 10 minutes. The reaction was stirred for 2.8 hours, the ethanol/$H_2O$ layer was removed using a separatory funnel. The remaining hexane solution was filtered through a 3 $\mu$m filter followed by a 1 $\mu$m filter. The filtrate was dried by flowing through a column of 4 Å molecular sieves (800 g) for 2.5 h and then filtered through a 0.05 $\mu$m filter. Hexanes were removed using a rotary evaporator to give 138 g of a white solid product. The GPC of this product, referenced to polystyrene standards gave a Mw of 22,660 with a polydispersity of 11.44.

EXAMPLE 4

75 Mole Percent Methylhydridosiloxane

A 250 mL Morton flask was fitted with a condenser and a stirrer connected to an Arrow 1750 motor. The flask was purged with $N_2$ and during the reaction $N_2$ was blown across the top of the condenser into an NaOH scrubber. 18 g of Amberjet 4200 (Cl) ion exchange resin catalyst, 20 mL of ethanol, 6.3 mL of water, and 250 mL of hexanes were added to the flask, and stirring was started. 4.5 mL of trichlorosilane (3.8 g, 0.028 Mol) and 16.0 mL of methyltrichlorosilane (12.6 g, 0.084 Mol) were combined together in an HDPE bottle. This mixture of silanes was added to the Morton flask through a peristaltic pump at a rate of 0.6 mL/min. After addition was completed, stirring was continued for 120 min. Solution was filtered by vacuum through a Whatman #4 filter in a Buchner funnel. Solution was added to a separatory funnel and the lower, aqueous layer was discarded. The upper layer was dried over 30.7 g of 4 Å molecular sieves for 2 hr. Solution was filtered by vacuum through a Whatman #1 filter paper in a Buchner funnel. Solution was evaporated on a Buchi rotary evaporator at 60° C. 11.0 g of a clear, high-viscosity liquid was collected. The GPC of this product, referenced to polystyrene standards, gave a Mw of 4746 amu.

EXAMPLE 5

80 Mole Percent Methylhydridosiloxane

A 1 L jacketed reactor equipped with a nitrogen inlet, dry ice condenser and a mechanical stirrer was charged with 1000 mL hexanes, 80 mL ethanol, 25 mL water and 61.3 g Amberjet 4200 catalyst. The mixture was equilibrated for 0.5 hr with stirring at 25° C. (circulating bath). A mixture of trichlorosilane (14.3 mL, 0.142 Mol) and methyltrichlorosilane (66.7 mL, 0.568 Mol) was added to the reactor using a peristaltic pump over a period of 35 minutes. Upon completion of the silane addition, hexane was pumped through the lines for 10 minutes. The reaction was stirred for 23 hours, then filtered through a Whatman #4 filter. The filtered solution was placed in a separatory funnel and the water/ethanol layer removed. The remaining hexane solution was dried over 4 Å molecular sieves (170 g) for 5 h and then filtered through a 1 $\mu$m filter. The hexanes were removed using a rotary evaporator to give a white solid product (23.1 g), 52% yield. The GPC of this product, referenced to polystyrene standards gave a Mw of 11,885 with a polydispersity of 6.5.

EXAMPLE 6

90 Mole Percent Methylhydridosiloxane

A 1 L jacketed reactor equipped with a nitrogen inlet, dry ice condenser and a mechanical stirrer was charged with 1000 mL hexanes. In a beaker, 160 mL ethanol, 50 mL water and 4.0 g tetrabutylammonium chloride were mixed until all solids were dissolved. This mixture was added to the hexane in the reactor and equilibrated for 0.5 hr with stirring at 25° C. A mixture of trichlorosilane (14.4 mL, 0.142 Mol) and methyltrichlorosilane (150 mL, 1.278 Mol) was added to the reactor using a peristaltic pump over a period of 60 minutes. Upon completion of the silane addition, hexane was pumped through the lines for 10 minutes. The reaction was stirred for 21 h, then filtered through a Whatman #4 filter. The filtered solution was placed in a separatory funnel and the water/ethanol layer was removed. The remaining hexane solution was dried over 4 Å molecular sieves (220 g) for 2 h and then filtered through a 1 μm filter. The hexanes were removed using a rotary evaporator to give a white solid product (70.4 g), 77% yield. The GPC of this product, referenced to polystyrene standards gave a Mw of 11,971 with a polydispersity of 6.3.

EXAMPLES 7 THROUGH 11

Examples 7 through 11 describe the synthesis of mixed substituent organohydridosiloxanes. These descriptions illustrate how more than one organic substituent is incorporated into the product resin while maintaining an 80 Mol % percent of organic containing substituent. It will be understood by one skilled in the art that other mixed substituent organohydridosiloxanes can be produced using the methods illustrated herein. In addition, it will be understood that by using the methods of Examples 1 to 6, mixed substituent organohydridosiloxanes having an organic molar content of other than 80 Mol % can also be produced.

EXAMPLE 7

50 Mole Percent Phenyl/30 Mole Percent Methyl Hydridosiloxane

A 6 L jacketed reactor equipped with a nitrogen inlet, dry ice condenser and a mechanical stirrer was charged with 2025 mL hexanes 324 mL ethanol, 28 mL water and 81 g of a 10% by weight tetrabutylammonium chloride hydrate solution in water. This mixture was equilibrated for 0.5 hr with stirring at 25° C. A mixture of trichlorosilane (75 g, 0.55 Mol) and methyltrichlorosilane (135 g, 0.90 Mol) and phenyltrichlorosilane (300 g, 1.42 Mol) was added to the reactor using a peristaltic pump over a period of 53 minutes. Upon completion of the silane addition, hexane was pumped through the lines for 10 minutes. The reaction was stirred for 23 hours, the ethanol/H$_2$O layer was removed using a separatory funnel. The remaining hexane solution was filtered through a 3 μm filter followed by a 1 μm filter. The filtrate was dried by flowing through a column of 4 Å molecular sieves (800 g) for 2.5 h and then filtered through a 0.05 μm filter. Hexanes were removed using a rotary evaporator to give a white solid product (33 g), 12% yield. The GPC of this product, referenced to polystyrene standards gave a Mw of 2500 amu.

EXAMPLE 8

15 Mole Percent Phenyl/65 Mole Percent Methyl Hydridosiloxane

A 6 L jacketed reactor equipped with a nitrogen inlet, dry ice condenser and a mechanical stirrer was charged with 4500 mL hexanes 720 mL ethanol, 63 mL water and 180 g of a 10% by weight tetrabutylammonium chloride hydrate solution in water. This mixture was equilibrated for 0.5 hr with stirring at 25° C. A mixture of trichlorosilane (173 g, 1.27 Mol) and methyltrichlorosilane (606 g, 4.05 Mol) and phenyltrichlorosilane (222 g, 0.95 Mol) were added to the reactor using a peristaltic pump over a period of 80 minutes. Upon completion of the silane addition, hexane was pumped through the lines for 10 minutes. The reaction was stirred for 24 hours, the ethanol/H$_2$O layer was removed using a separatory funnel. The remaining hexane solution was filtered through a 3μm filter followed by a 1 μm filter. The filtrate was dried by flowing through a column of 4 Å molecular sieves (800 g) for 2.5 h and then filtered through a 0.05 μm filter. Hexanes were removed using a rotary evaporator to give a white solid product (212 g), 47% yield. The GPC of this product, referenced to polystyrene standards gave an Mw of 36,697 with a polydispersity of 22.5.

EXAMPLE 9

20 Mole Percent t-Butyl/60 Mole Percent Methyl Hydridosiloxane

A 6 L jacketed reactor equipped with a nitrogen inlet, dry ice condenser and a mechanical stirrer was charged with 4500 mL hexanes 750 mL ethanol, 91 mL water and 180 g of a 100 by weight tetrabutylammonium chloride hydrate solution in water. This mixture was equilibrated for 0.5 hr with stirring at 25° C. A mixture of trichlorosilane (173 g, 1.27 Mol) and methyltrichlorosilane (573 g, 3.83 Mol) and t-butyltrichlorosilane (245 g, 1.27 Mol) were added to the reactor using a peristaltic pump over a period of 73 minutes. Upon completion of the silane addition, hexane was pumped through the lines for 10 minutes. The reaction was stirred for 22 hours, the ethanol/H$_2$O layer was removed using a separatory funnel. The remaining hexane solution was filtered through a 3 μm filter followed by a 1 μm filter. The filtrate was dried by flowing through a column of 4 Å molecular sieves (800 g) for 2.5 h and then filtered through a 0.05 μm filter. Hexanes were removed using a rotary evaporator to give a white solid product (188.5 g), 42% yield. The GPC of this product, referenced to polystyrene standards gave a Mw of 13,016 with a polydispersity of 9.6.

EXAMPLE 10

20 Mole Percent Benzyl/60 Mole Percent Methyl Hydridosiloxane

A 6 L jacketed reactor equipped with a nitrogen inlet, dry ice condenser and a mechanical stirrer was charged with 4500 mL hexanes 720 mL ethanol, 63 mL water and 180 g of a 10% by weight tetrabutylammonium chloride hydrate solution in water. This mixture was equilibrated for 0.5 hr with stirring at 25° C. A mixture of trichlorosilane (173 g, 1.27 Mol) and methyltrichlorosilane (573 g, 3.83 Mol) and t-butyltrichlorosilane (288 g, 1.27 Mol) were added to the reactor using a peristaltic pump over a period of 70 minutes. Upon completion of the silane addition, hexane was pumped through the lines for 10 minutes. The reaction was stirred for 19.5 hours, the ethanol/H$_2$O layer was removed then the hexane solution was filtered through a 3 μm filter followed by a 1 μm filter. The filtered solution was dried by flowing through a column of 4 Å molecular sieves (800 g) for 2.5 h and then filtered through a 0.05 μm filter. The hexanes were removed using a rotary evaporator to give a white solid product (288 g), 58% yield. The GPC of this product, referenced to polystyrene standards gave a Mw of 30,565 with a polydispersity of 22.9.

EXAMPLE 11

20 Mole Percent Chloromethyl/60 Mole Percent Methyl Hydridosiloxane

A 6 L jacketed reactor equipped with a nitrogen inlet, dry ice condenser and a mechanical stirrer was charged with 4500 mL hexanes 720 mL ethanol, 63 mL water and 180 g of a 10% by weight tetrabutylammonium chloride hydrate solution in water. This mixture was equilibrated for 0.5 hr with stirring at 25° C. A mixture of trichlorosilane (173 g, 1.27 Mol) and methyltrichlorosilane (573 g, 3.83 Mol) and chloromethyltrichlorosilane (236 g, 1.27 Mol) were added to the reactor using a peristaltic pump over a period of 70 minutes. Upon completion of the silane addition, hexane was pumped through the lines for 10 minutes. The reaction was stirred for 20.5 hours, the ethanol/H$_2$O layer was removed then the hexane solution was filtered through a 3 μm filter followed by a 1 μm filter. The filtered solution was dried by flowing through a column of 4 Å molecular sieves (800 g) for 2.5 h and then filtered through a 0.05 μm filter. The hexanes were removed using a rotary evaporator to give a white solid product (174 g). The GPC of this product, referenced to polystyrene standards gave a Mw of 32,408 with a polydispersity of 13.11.

EXAMPLES 12 TO 16

Examples 12 to 16 illustrate alternate methods for the synthesis of 80 Mol % methylhydridosiloxane. Thus the use of alternate catalysts, solvents and reaction times are illustrative of the methods that can be readily employed by one of ordinary skill in the art to produce organohydridosiloxanes resins in accordance with the present invention. It will be understood that these methods can be used in the synthesis of other organohydridosiloxanes having other substituents and other Mole percent of organic substituent content.

EXAMPLE 12

80 Mole Percent Methylhydridosiloxane

A 1 L jacketed reactor equipped with a nitrogen inlet, dry ice condenser and a mechanical stirrer was charged with 1000 mL hexanes. In a beaker, 160 mL ethanol, 50 mL water and 4.0 g tetrabutylammonium chloride were mixed until all solid was dissolved. This mixture was added to the hexane in the reactor and equilibrated for 0.5 hr with stirring at 25° C. A mixture of trichlorosilane (28.6 mL, 0.284 Mol) and methyltrichlorosilane (133 mL, 1.136 Mol) were added to the reactor using a peristaltic pump over a period of 75 minutes. Upon completion of the silane addition, hexane was pumped through the lines for 10 minutes. The reaction was stirred for 4 hr 15 min, then filtered through a Whatman #4 filter. The filtered solution was placed in a separatory funnel and the water/ethanol layer was removed. The hexane solution was dried over 4 Å molecular sieves (220 g) for 2.5 h and then filtered through a 1 μm filter. The hexanes were removed using a rotary evaporator to give a white solid product (64.4g), 73% yield. The GPC of this product, referenced to polystyrene standards gave a Mw of 20,644 with a polydispersity of 9.6.

EXAMPLE 13

80 Mole Percent Methylhydridosiloxane Benzyltrimethylammonium Chloride Phase Transfer Catalyst A 6 L jacketed reactor equipped with a nitrogen inlet, dry ice condenser and a mechanical stirrer was charged with 4500 mL hexanes 720 mL ethanol, 63 mL water and 180 g of a 10% by weight benzyltrimethylammonium chloride solution in water. This mixture was equilibrated for 0.5 hr with stirring at 25° C. A mixture of trichlorosilane (96 g, 0.7 Mol) and methyltrichlorosilane (471 g, 3.15 Mol) were added to the reactor using a peristaltic pump over a period of 73 minutes. Upon completion of the silane addition, hexane was pumped through the lines for 10 minutes. The reaction was stirred for 15.3 hours, the ethanol/H2O layer was removed then the hexane solution was filtered through a 3 μm filter followed by a 1 μm filter. The filtered solution was dried by flowing through a column of 4 Å molecular sieves (800 g) for 2.5 h and then filtered through a 0.05 μm filter. The hexanes were removed using a rotary evaporator to give a white solid product (161 g), 52% yield. The GPC of this product, referenced to polystyrene standards gave a Mw of 29,251 with a polydispersity of 11.27.

EXAMPLE 14

80 Mole Percent Methylhydridosiloxane Tetrabutylammonium Chloride Phase Transfer Catalyst A 6 L jacketed reactor equipped with a nitrogen inlet, dry ice condenser and a mechanical stirrer was charged with 4500 mL hexanes 720 mL ethanol, 63 mL water and 180 g of a 10% by weight tetrabutylammonium chloride solution in water. This mixture was equilibrated for 0.5 hr with stirring at 25° C. A mixture of trichlorosilane (96 g, 0.7 Mol) and methyltrichlorosilane (471 g, 3.15 Mol) were added to the reactor using a peristaltic pump over a period of 73 minutes. Upon completion of the silane addition, hexane was pumped through the lines for 10 minutes. The reaction was stirred for 15.3 hours, the ethanol/H$_2$O layer was removed then the hexane solution was filtered through a 3 μm filter followed by a 1 μm filter. The filtered solution was dried by flowing through a column of 4 Å molecular sieves (800 g) for 2.5 h and then filtered through a 0.05 μm filter. The hexanes were removed using a rotary evaporator to give a white solid product (225 g), 73% yield. The GPC of this product, referenced to polystyrene standards gave a Mw of 33,589 with a polydispersity of 12.84.

EXAMPLE 15

80 Mole Percent Methylhydridosiloxane with High Molecular Weight

A 6 L jacketed reactor equipped with a nitrogen inlet, dry ice condenser and a mechanical stirrer was charged with 4500 mL hexanes 720 mL ethanol, 63 mL water and 180 g of a 10% by weight tetrabutylammonium chloride hydrate solution in water. This mixture was equilibrated for 0.5 hr with stirring at 25° C. A mixture of trichlorosilane (96 g, 0.7 Mol) and methyltrichlorosilane (471 g, 3.15 Mol) were added to the reactor using a peristaltic pump over a period of 105 minutes. Upon completion of the silane addition, hexane was pumped through the lines for 10 minutes. The reaction was stirred for 22 hours, the ethanol/H$_2$O layer was removed then the hexane solution was filtered through a 3 μm filter followed by a 1 μm filter. The filtered solution was dried by flowing through a column of 4 Å molecular sieves (800 g) for 2.5 h and then filtered through a 0.05 μm filter. The hexanes were removed using a rotary evaporator to give a white solid product (268.3 g), 87% yield. The GPC of this product, referenced to polystyrene standards gave a Mw of 60,251 with a polydispersity of 20.6.

EXAMPLE 16

80 Mole Percent Methylhydridosiloxane with Low Metal Content

A 6 L jacketed reactor equipped with a nitrogen inlet, dry ice condenser and a mechanical stirrer was charged with 4500 mL hexanes 720 mL ethanol, 63 mL water and 180 g of a 10% by weight tetrabutylammonium chloride hydrate solution in water. This mixture was equilibrated for 0.5 hr with stirring at 25° C. A mixture trichlorosilane (96 g, 0.7 Mol) and methyltrichlorosilane (471 g, 3.15 Mol) were added to the reactor using a peristaltic pump over a period of 105 minutes. Upon completion of the silane addition, hexane was pumped through the lines for 10 minutes. The reaction was stirred for 2 hours, then the stirrer was turned off overnight. The following morning the mixture was stirred for an additional 45 minutes. The ethanol/H$_2$O layer was removed then the hexane solution was filtered through a 3 μm filter followed by a 1 μm filter. The filtered solution was dried by flowing through a column of 4 Å molecular sieves (800 g) for 2.5 h and then filtered through a 0.05 μm filter. The hexanes were removed using a rotary evaporator to give a white solid product (263.2 g), 85% yield. The GPC of this product, referenced to polystyrene standards gave a Mw of 32,001 with a polydispersity of 13.6.

Example 17 illustrates the synthesis of a control hydridosiloxane having no organic content. This resin is shown for comparison dielectric constant measurements only.

EXAMPLE 17

Hydridosiloxane Polymer

A 6 L jacketed reactor equipped with a nitrogen inlet, dry ice condenser and a mechanical stirrer was charged with 5500 mL hexanes 440 mL ethanol, 142 mL water and 330 g Amberjet 4200 catalyst. This mixture was equilibrated for 0.5 hr with stirring at 25° C. Trichlorosilane (380 g, 2.80 Mol) was added to the reactor using a peristaltic pump over a period of 55 minutes. Upon completion of the silane addition, hexane was pumped through the lines for 10 minutes. The reaction was stirred for 100 min, the ethanol/H$_2$O layer was removed then the hexane solution was filtered through a 3 μm filter followed by a 1 μm filter. The filtered solution was dried by flowing through a column of 4 Å Molecular sieves (400 g) for 2.5 h and then filtered through a 0.05 μm filter. The hexanes were removed using a rotary evaporator to give 131 g of a white solid product. The GPC of this product, referenced to polystyrene standards gave a Mw of 21,035 with a polydispersity of 7.39.

The organohydridosiloxane resins of Examples 5, 6, 8, 9, 12, 14 and 17 were formed into a coating solution and spin-coated onto a silicon substrate to form films having a nominal thickness of 4000 Å. Films of Examples 5, 6, 8 and 9 were cured at 400 degrees Centigrade (° C.), films of Examples 12 and 14 were cured at 380° C., and additional samples of films of Example 14 were cured at 425° C. and 450° C. Films of Example 17, used as controls, were cured at each of the four temperatures and are referred to as Control #1 through #4, respectively. The dielectric constants of the films for each example are shown in Table 1, below.

TABLE 1

DIELECTRIC CONSTANT MEASUREMENTS.

| Mol % organic substituent used to make resin | Cure Temperature | Dielectric Constant (1 MHz) |
|---|---|---|
| Control #1 no carbon containing hydridosiloxane | 380° C. | 3.06 |
| 80% Methyl (example 12) | 380° C. | 2.50 |
| 80% Methyl (example 14) | 380° C. | 2.43 |
| Control #2 no carbon containing hydridosiloxane | 400° C. | 3.27 |
| 80% Methyl (example 5) | 400° C. | 2.64 |

TABLE 1-continued

DIELECTRIC CONSTANT MEASUREMENTS.

| Mol % organic substituent used to make resin | Cure Temperature | Dielectric Constant (1 MHz) |
|---|---|---|
| 90% Methyl (example 6) | 400° C. | 2.64 |
| 15% Phenyl/65% methyl (example 8) | 400° C. | 2.66 |
| 20% t-Butyl/60% methyl (example 9) | 400° C. | 2.59 |
| Control #3 no carbon containing hydridosiloxane | 425° C. | 3.34 |
| 80% Methyl (example 14) | 425° C. | 2.53 |
| Control #4 no carbon containing hydridosiloxane | 450° C. | 3.58 |
| 80% Methyl (example 14) | 450° C. | 2.51 |

An 18% by weight solution of the polymer of Example 12 in methyl isobutyl ketone (MIBK) was monitored over a fifteen month period by GPC. The Mw of the polymer in solution recorded at 2 and 9 month intervals indicate the stability of resins in accordance with the present invention. It should be noted that the resin of Example 12 was produced in a manner consistent with the methods shown in the other fifteen examples presented. Thus the results of Table 2 are believed typical for resins in accordance with the present invention. (variations in the measurement can be attributed to the error in the instrument which is +/−500 amu).

TABLE 2

POLYMER STABILITY IN SOLUTION

| Number of Days | Mw (GPC) |
|---|---|
| Day 0 | 20,296 amu |
| Day 51 | 21,302 amu |
| Day 214 | 20,821 amu |
| Day 405 | 23,016 amu |

In view of the foregoing, it will be understood that the present invention provides organohydridosiloxane polymer compositions having a caged conformation polymer backbone and a carbon containing substituent content of at least approximately 40 Mol %. The hydrido and organic substituents are bonded directly to backbone silicon atoms in the polymer allowing for essentially no hyroxyl or alkoxy groups thereby suppressing hydrolysis and the formation of silanol moieties. In this manner, subsequent chain extension via condensation of the silanol moieties is suppressed. It is evident that the very low levels of hydroxyl and alkoxy substituents, if any, and the absence of terminal silicon alkoxy or hydroxy groups provide for stable organohydridosiloxane solutions. It is also evident that the very low levels of silanol moieties, if any, in final films of resins in accordance with the present invention, is a significant factor in these films having dielectric constants typically 2.7 or less. It is further evident that the presence of organic side groups substantially increases the thermal stability of the composition permitting higher cure temperatures, for example, to a temperature of about 425° C. or higher. Referring to Table 1, this enhanced stability is evidenced by the consistently low dielectric constant, below approximately 2.7, and the consistency of this value at the various curing temperatures. In comparison, the non-organic containing resins of Controls 1 to 4 exhibit a consistent increase in dielectric constant with increasing cure temperature, suggesting thermal instability.

The present invention includes a novel process for making the organohydridosiloxane polymer composition of this invention and includes a dual phase solvent system, a non-participating catalyst, and trihalosilane and organotrihalosilane Co-monomers. It is evident that the amount of carbon in the composition is controllable by the relative ratios of the Co-monomers. It is also evident that the complete absence of the acidic or metal catalysts typically employed to form the previously known HSQ resins and the use of a dual phase solvent system renders the product composition of the process extremely pure and free of metal salts, and other ionic contaminants.

We claim:

1. An organohydridosiloxane resin with high organic content comprising a polymer having a general formula:

$$(H_{0-1.0}SiO_{1.5-2.0})_n(RSiO_{1.5})_m;$$

wherein the sum of n and m is from about 8 to about 5000 and m is selected such that m/(n+m) is 0.4 or greater;

wherein R is selected from chloro-substituted and unsubstituted normal and branched alkyl groups, chloro-substituted and unsubstituted cycloalkyl groups, aryl groups, and mixtures thereof; and wherein the polymer has essentially no hydroxyl or alkoxy groups bonded to silicon atoms.

2. The polymer as in claim 1 wherein the conformation of said organohydridosiloxane resin is a cage.

3. The polymer as in claim 1 wherein said organohydridosiloxane resin has a weight average molecular weight of between about 400 and about 200,000 atomic mass units.

4. The polymer as in claim 1 wherein said organohydridosiloxane resin has a weight average molecular weight of between about 20,000 and about 40,000 atomic mass units.

5. The polymer as in claim 1 wherein 'R' is an organic substituent selected from the group consisting of chloro-substituted and unsubstituted, normal and branched alkyl groups having between 1 and 20 carbons, chloro-substituted and unsubstituted cycloalkyl groups having between 4 and 10 carbons, aryl groups having between 6 and 20 carbons, and mixtures thereof.

6. The polymer as in claim 1 wherein 'R' is an organic substituent selected from the group consisting of methyl, t-butyl, phenyl, benzyl, chloromethyl and mixtures thereof.

* * * * *